United States Patent
Kalnitsky et al.

(10) Patent No.: US 7,755,117 B2
(45) Date of Patent: Jul. 13, 2010

(54) LIGHT SENSORS WITH INFRARED SUPPRESSION

(75) Inventors: Alexander Kalnitsky, San Francisco, CA (US); Dong Zheng, San Jose, CA (US); Joy Jones, Fremont, CA (US); Xijian Lin, Fremont, CA (US); Gregory Cestra, Pleasanton, CA (US)

(73) Assignee: Intersil Americas Inc., Milpitas, CA (US)

( * ) Notice: Subject to any disclaimer, the term of this patent is extended or adjusted under 35 U.S.C. 154(b) by 615 days.

(21) Appl. No.: 11/621,443

(22) Filed: Jan. 9, 2007

(65) Prior Publication Data

US 2008/0135968 A1 Jun. 12, 2008

Related U.S. Application Data

(60) Provisional application No. 60/869,700, filed on Dec. 12, 2006.

(51) Int. Cl.
 *H01L 31/062* (2006.01)
(52) U.S. Cl. ............ 257/291; 257/292; 257/294; 257/E27.133
(58) Field of Classification Search .......... 257/291, 257/292, 294, 461, E27.133
See application file for complete search history.

(56) References Cited

U.S. PATENT DOCUMENTS

| | | | |
|---|---|---|---|
| 4,096,512 A | 6/1978 | Polinsky | |
| 4,870,495 A | 9/1989 | Kinoshita et al. | |
| 5,130,775 A | 7/1992 | Maeda et al. | |
| 5,726,440 A | 3/1998 | Kalkhoran et al. | |
| 6,157,035 A | 12/2000 | Kuijk et al. | |
| 6,218,719 B1 | 4/2001 | Tsang | |
| 6,359,293 B1 | 3/2002 | Woodward | |
| 6,596,981 B1 | 7/2003 | Aswell et al. | |
| 6,724,063 B2 | 4/2004 | Kuhara et al. | |
| 6,998,207 B2 | 2/2006 | Yaung | |
| 7,163,832 B2 | 1/2007 | Kim | |
| 2002/0047174 A1 | 4/2002 | De Pauw et al. | |
| 2004/0012556 A1 | 1/2004 | Yong et al. | |
| 2004/0089790 A1 | 5/2004 | Rubin et al. | |

(Continued)

FOREIGN PATENT DOCUMENTS

EP 97870061.5 4/1997

(Continued)

OTHER PUBLICATIONS

Bontems et al., "Synthesis and Properties of Monodisperse Polydimethylsiloxane Networks"; 907 Journal of Polymer Science Part A: Polymer Chemistry Edition 31 (Oct. 1993), No. 11, New York, US; pp. 2697-2710.

(Continued)

*Primary Examiner*—Minh-Loan T Tran
(74) *Attorney, Agent, or Firm*—Fliesler Meyer LLP

(57) ABSTRACT

Embodiments of the present invention are directed to light sensors, that primarily respond to visible light while suppressing infrared light. Such sensors are especially useful as ambient light sensors because such sensors can be used to provide a spectral response similar to that of a human eye. Embodiments of the present invention are also directed to methods of providing such light sensors, and methods for using such light sensors.

10 Claims, 13 Drawing Sheets

U.S. PATENT DOCUMENTS

2006/0208333 A1   9/2006   Goto

FOREIGN PATENT DOCUMENTS

| | | |
|---|---|---|
| EP | 0 875 939 A1 | 4/1998 |
| EP | 0 877 426 A1 | 11/1998 |
| EP | 1 107 222 | 6/2001 |
| EP | 1 432 044 | 6/2004 |
| EP | 1 630 871 | 3/2006 |
| EP | 1 703 562 | 9/2006 |
| WO | WO 2006/113300 | 10/2006 |

OTHER PUBLICATIONS

Les Hodson, "Unlocking Digital Light Conversion," Hearst Electronic Products, http://www.electronicproducts.com/ShowPage.asp?SECTION=3700&PRIMID=&FileName=febtaol.feb2002, 4 pages (Feb. 2002).

Kuijk et al., "Spatially Modulated Light Detector in CMOS with Sense-Amplifier Receiver Operating at 180 Mb/s for Optical Data Link Applications and Parallel Optical Interconnects Between Chips," IEEE J. Selected Topics Quantum Electronics 4(6):1040-1045 (1998).

Lalanne and Rodier, "CMOS Photidiodes Based on Vertical P-N-P Junctions,"Institut d'Optique Théorique et Appliquée, pp. 1-8, CNRS, BP 147, F91 403 Orsay Cedex, France, http://ipdps.cc.gatech.edu/1997/wocs/lalanne.pdf.

Rooman et al., "Asynchronous 250-Mb/s Optical Receivers with Integrated Detector in Standard CMOS Technology for Optocoupler Applications," IEEE J. Solid-State Circuits 35(7):953-958 (2000).

Windisch et al., "Large-Signal-Modulation of High-Efficiency Light-Emitting Diodes for Optical Communication"; IEEE Journal of Quantum Electronics, vol. 36, No. 12, Dec. 2000; pp. 1445-1453.

Woodward et al., "1-Gb/s Integrated Optical Detectors and Receivers in Commercial CMOS Technologies," IEEE J. Selected Topics Quantum Electronics 5(2):146-158 (1999).

Zimmermann, ed., "Integrated Silicon Opto-electronics," Photonics pp. 4-6, 15-22, Springer (2000).

Zhang et al., "Performance of a CMOS Compatible Lateral Bipolar Photodetector on SOI Substrate," IEEE Electron Device Letts. 19(11):435-437 (1998).

"Photodetector Elements," 3 pp., http://www.iee.et.tu-dresden.de/iee/eb/analog/papers/mirror/visionchip.../photodetector.htm, printed Oct. 24, 2002.

"APC Amplifier with Integrated Photodetector for 24X CD-R and CD-RW Applications," pp. 1-7, Sipex SP8020, Sipex Corporation, Mar. 9, 2001.

TSL2550, "Ambient Light Sensor with SMBus Interface,"pp. 1-18, TAOS Inc., (2005).

ISL29001, "Light to Digital Sensor," pp. 1-10, Intersil Americas Inc. (2005).

S9066-01, S9067-01, "Spectral Response Close to Human Eye Sensitivity," pp. 1-2, Hamamatsu Photonics K.K., (Mar. 2005).

International Search Report for PCT/US03/33301 (mailed May 18, 2005).

Blanksby, "Performance Analysis of a Color CMOS Photogate Image Sensor," Electron Devices, IEEE Transactions on, vol. 47 (1), pp. 55-64 (Jan. 1, 2000).

International Search Report for PCT/US2007/086528 (Feb. 10, 2009).

"TSMC Begins Volume Production of CMOS Image Sensors,"Digital Photography Review, http://www.dpreview.com/news/0005/0051503tsmc_cmos.asp, 2 pages (May 16, 2000).

"Tower Semiconductor Unveils Advanced CMOS Image Sensor Manufacturing Technology Services with Color Filter and Stitching Capabilities," Tower Semiconductor Ltd., http://www.towersemi.com/pages/news_archive_content.asp?intGlobalId=176&intLevel=0&intDeep=4, 3 pages (Aug. 2, 1999).

Miller, Harris R., "Color Filter Array for CCD and CMOS Image Sensors Using a Chemically Amplified, Thermally Cured, Pre-Dyed, Positive-Tone Photoresist for 365 nm Lithography," CAT.INIST, http://cat.inist.fr/?aModele=afficheN&cpsidt=17387091, 2 pages (2006).

"Colour Filters for CMOS Sensors—Tower Semiconductor's Colur Filter Deposition Process—Product Information," Miller Freeman UK Ltd., http://findarticles.com/p/articles/mi_m0WVI/is_1999_March_15/ai_54143252, 1 page (Mar. 15, 1999).

"CMOS Pixel Structure," Micron Technology, Inc., http://www.micron.com/innovations/imaging/pixel, 2 pages (2006).

"An Introduction to CMOS Image Sensor Technology," CMOS Primer, http://www.siliconimaging.com/ARTICLES/CMOS%20PRIMER.htm, 15 pages (accessed Jan. 24, 2007).

International Search Report for PCT/US2007/086528 (Oct. 27, 2008).

Intelligent Opto Sensor, Designer's Notebook, Controlling a Backlight with the TSL2550 Ambient Light Sensor, Mar. 6, 2003, http://www.laosinc.com/downloads/pdf/DN7_ALS.pdf.

"LCD Backlight Control," Monolithic Power Systems, Inc. (2006), http://www.actel.com/documents/Fusion_LCD_AB.pdf.

LIGHT SENSORS WITH INFRARED SUPPRESSION

PRIORITY CLAIM

This application claims priority under 35 U.S.C. 119(e) to U.S. Provisional Patent Application No. 60/869,700, filed Dec. 12, 2006, entitled "Light Sensors with Infrared Suppression", which is incorporated herein by reference.

FIELD OF THE INVENTION

The present invention relates generally to light sensors. Specific embodiments are directed to improved CMOS light sensors that have a spectral response close to that of a human eye.

BACKGROUND

There has recently been an increased interest in the use of ambient light sensors, e.g., for use as energy saving light sensors for displays, for controlling backlighting in portable devices such as cell phones and laptop computers, and for various other types of light level measurement and management. Additionally, for various reasons, there is an interest implementing such ambient light sensors using complementary-metal-oxide semiconductor (CMOS) technology. First, CMOS circuitry is generally less expensive than other technologies, such as Gallium Arsenide or bipolar silicon technologies. Further, CMOS circuitry generally dissipates less power than other technologies. Additionally, CMOS photodetectors can be formed on the same substrate as other low power CMOS devices, such as metal-oxide semiconductor field effect transistors (MOSFETs).

FIG. 1 shows a cross section of a conventional CMOS light sensor 102, which is essentially a single CMOS photodiode, also referred to as a CMOS photodetector. The light sensor 102 includes an $N^+$ region 104, which is heavily doped, and a $P^-$ region 106 (which can be a $P^-$ epitaxial region), which is lightly doped. All of the above is likely formed on a $P^+$ or $P^{++}$ substrate, which is heavily doped. It is noted that FIG. 1 and the remaining FIGS. that illustrate light sensors are not drawn to scale.

Still referring to FIG. 1, the $N^+$ region 104 and $P^-$ region 106 form a PN junction, and more specifically, a $N^+/P^-$ junction. This NP junction is reversed biased, e.g., using a voltage source (not shown), which causes a depletion region around the PN junction. When light 112 is incident on the photodetector 102 (and more specifically on the $N^+$ region 104), electron-hole pairs are produced in and near the diode depletion region. Electrons are immediately pulled toward $N^+$ region 104, while holes get pushed down toward $P^-$ region 106. These electrons (also referred to as carriers) are captured in $N^+$ region 104 and produce a measurable photocurrent, which can be detected, e.g., using a current detector (not shown). This photocurrent is indicative of the intensity of the light 112, thereby enabling the photodetector to be used as a light sensor.

A problem with such a conventional photodetector is that it detects both visible light and non-visible light, such as infrared (IR) light. This can be appreciated from the graph in FIG. 2, which illustrates an exemplary spectral response of a human eye. Notice that the human eye does not detect IR light, which starts at about 800 nm. Thus, the response of a conventional photodetector can significantly differ from the response of a human eye, especially when the light 112 is produced by an incandescent light, which produces large amounts of IR light. This provides for significantly less than optimal adjustments where such a sensor 102 is used for adjusting backlighting, or the like.

There is a desire to provide light sensors that have a spectral response closer to that of a human eye. Such light sensors can be used, e.g., for appropriately adjusting the backlighting of displays, or the like.

SUMMARY

Embodiments of the present invention are directed to light sensors, which are especially useful as ambient light sensors because such sensors can be used to provide a spectral response similar to that of a human eye.

In accordance with specific embodiments, a light sensor includes a layer of a first conductivity type and a region of a second conductivity type in the layer of the first conductivity type and forming a PN junction photodiode with the layer of the first conductivity type. Additionally, an oxide layer is below the PN junction. Carriers are produced in the layer of the first conductivity type when light, including both visible light and infrared (IR) light, is incident on the light sensor. A portion of the carriers produced due to the visible light are captured by the region of the second conductivity type and contribute to a photocurrent generated by the light sensor. A further portion of the carriers, produced due to the IR light that penetrates through the oxide layer, are absorbed by the oxide layer and/or a material below the oxide layer and thus do not contribute to the photocurrent, resulting in the photocurrent being primarily representative of the visible light.

In accordance with specific embodiments, the layer of the first conductivity type can be a P− layer, and the region of the second conductivity type can be an N+ region. In other embodiments, the layer of the first conductivity type can be an N− layer, and the region of the second conductivity type can be a P+ region.

In accordance with further embodiments of the present invention, a light sensor includes a layer of a first conductivity type, and first and second regions of a second conductivity type in the layer of the first conductivity type. The first region of the second conductivity type and the layer of the first conductivity type forms a first PN junction photodiode. The second region of the second conductivity type and the layer of the first conductivity type form a second PN junction photodiode. At least one further layer intrinsic to CMOS technology covers the second region of the second conductivity type (but not the first region of the second conductivity), where the at least one further layer blocks visible light while allowing at least a portion of infrared (IR) light to pass therethrough. Carriers are produced in the layer of the first conductivity type when light, including both visible light and IR light, is incident on the light sensor. A portion of the carriers produced due to the visible light and the IR light incident on the first region of the second conductivity type are captured by the first region of the second conductivity type and contribute to a first photocurrent that is indicative of both the visible light and the IR light. A further portion of the carriers, produced due to the IR light that passes through the at least one further layer, are captured by the second region of the second conductivity type and contribute to a second photocurrent that is indicative of the IR light. A differential photocurrent, produced by determining a difference between the first and second photocurrents, has a spectral response with a significant part of the IR light removed. The difference used to produce the differential current can be a weighted difference that compensates for at least a portion of the IR light not passing through the at least one further layer.

In accordance with specific embodiments, the layer of the first conductivity type can be a P− layer, the first region of the second conductivity type can be a first N+ region, and the second region of the second conductivity type can be a second N+ region. In other embodiments, the layer of the first conductivity type can be an N− layer, the first region of the second conductivity type can be a first P+ region, and the second region of the second conductivity type can be a second P+ region.

In accordance with certain embodiments, the at least one further layer includes a layer of silicide. In some embodiments, the at least one further layer includes a layer of Poly-Silicon covering the second region of the second conductivity type. A layer of silicide can be over the Poly-Silicon. More than on layer of Poly-Silicon can be used, with or without a layer of silicide over the uppermost layer of Poly-Silicon.

In accordance with other embodiments of the present invention, a light sensor includes a layer of a first conductivity type, and a first region of a second conductivity type in the layer of the first conductivity type and forming a first PN junction photodiode with the layer of the first conductivity type. A well of the second conductivity type is also in the layer of the first conductivity type and forms a second PN junction photodiode with the layer of the first conductivity type. Additionally, a second region of the second conductivity type is in the well of the second conductivity type, where the second region of the second conductivity type is more heavily doped than the well of the second conductivity type. Carriers are produced in the layer of the first conductivity type when light, including both visible light and infrared (IR) light, is incident on the light sensor. A portion of the carriers produced due to the visible light and the IR light incident on the first region of the second conductivity type are captured by the first region of the second conductivity type and contribute to a first photocurrent that is indicative of both the visible light and the IR light. A further portion of the carriers, produced due to the IR light that passes through the well of the second conductivity type, are captured by the second region of the second conductivity type in the well of the second conductivity type and contribute to a second photocurrent that is indicative of the IR light. A differential photocurrent, produced by determining a difference between the first and second photocurrents, has a spectral response with a significant portion of the IR light removed. The difference used to produce the differential current can be a weighted difference that compensates for at least a portion of the IR light not passing through the at least one further layer.

The layer of the first conductivity type can be a P− layer, the first region of the second conductivity type can be a first N+ region, the well of the second conductivity type can be an Nwell, and the second region of the second conductivity type can be a second N+ region. Alternatively, the layer of the first conductivity type can be an N− layer, the first region of the second conductivity type can be a first P+ region, the well of the second conductivity type can be a Pwell, and the second region of the second conductivity type can be a second P+ region.

In certain embodiments, at least one further layer intrinsic to CMOS technology covers the second region of the second conductivity type (but not the first region of the second conductivity type), where the at least one further layer blocks visible light while allowing at least a portion of infrared (IR) light to pass therethrough. In accordance with certain embodiments, the at least one further layer includes a layer of silicide. In some embodiments, the at least one further layer includes a layer of Poly-Silicon covering the second region of the second conductivity type. A layer of silicide can be over the Poly-Silicon. More than on layer of Poly-Silicon can be used, with or without a layer of silicide over the uppermost layer of Poly-Silicon.

This summary is not intended to be a complete description of the embodiments of the present invention. Further and alternative embodiments, and the features, aspects, and advantages of the present invention will become more apparent from the detailed description set forth below, the drawings and the claims.

DETAILED DESCRIPTION

Light is absorbed with a characteristic depth determined by the wavelength of light. For certain wavelengths, such as visible light in the range of about 400 to 700 nm, the absorption depth is about 3.5 microns or less. In contrast, for IR light the absorption depth is greater than that of visible light. For example, the absorption depth for 800 nm IR light is about 8 microns, and the absorption depth for 900 nm IR light is greater than 20 microns. Embodiments of the present invention, as will be described below, take advantage of this phenomenon.

Figure 3:
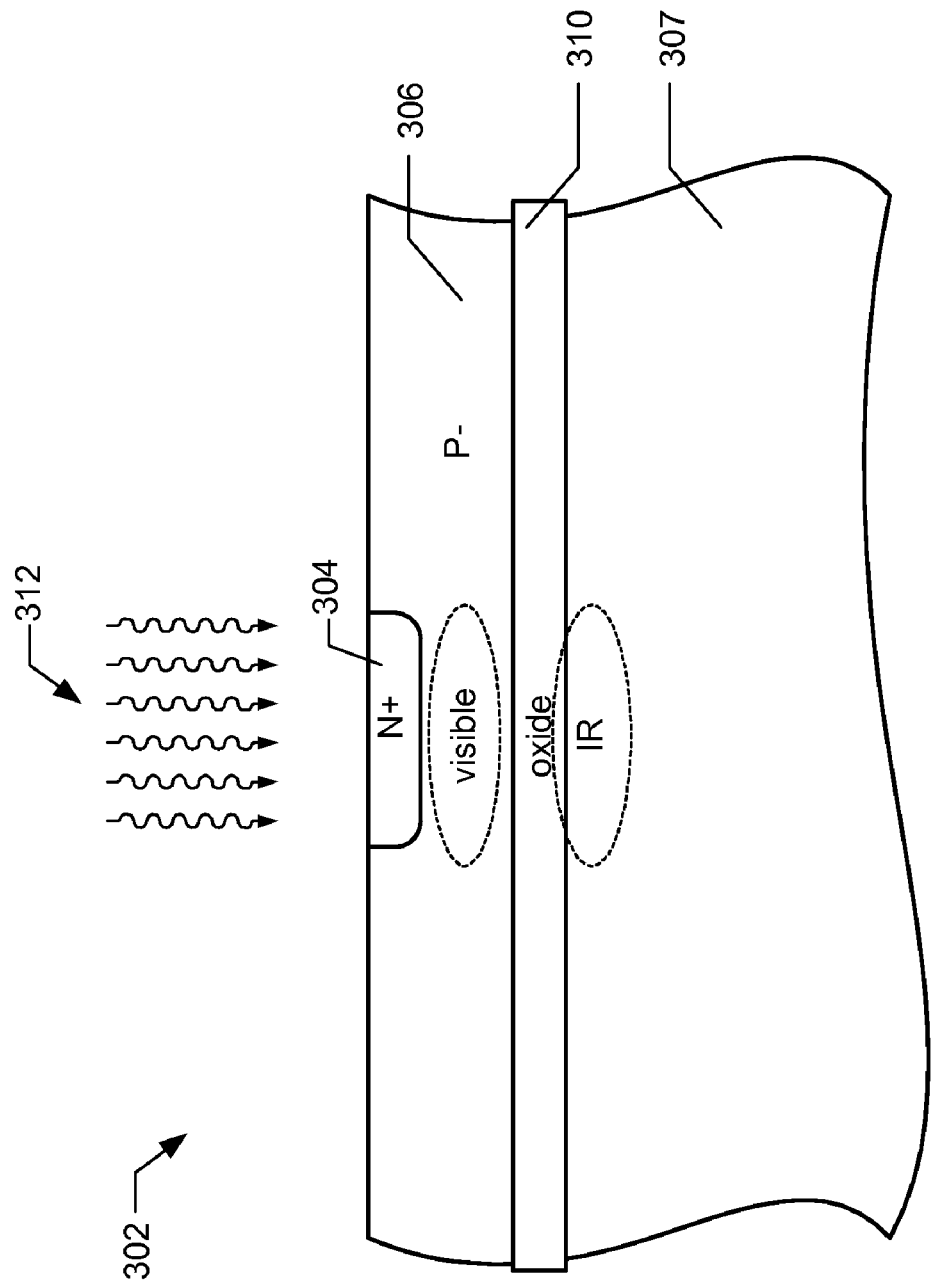
FIG. 3 is a cross-sectional view of a light sensor according to an embodiment of the present invention.

FIG. 3 is a cross sectional view of a CMOS light sensor 302 according to an embodiment of the present invention. The light sensor 302 includes an $N^+$ region 304 within a relatively shallow $P^-$ layer 306, below which an oxide layer 310 is provided. The oxide layer 310 can be, e.g. a silicon dioxide, but is not limited thereto. The $P^-$ layer 306 can be a $P^-$ epitaxial layer, but need not be.

In accordance with specific embodiments, the depth or thickness of the $N^+$ region 304 ranges from about 0.05 to 0.15 microns, and the depth or thickness of the $P^-$ layer 306 ranges from about 0.1 to 0.3 microns, with the thickness of the $P^-$ layer 306 preferable being about twice the thickness of the $N^+$ region 304. In accordance with specific embodiments, the thickness of the oxide layer 310 is an odd multiple of a quarter wavelength of the IR light. Presuming IR light of 800 nm, and thus a quarter wavelength of 200 nm (i.e., 0.2 microns), the thickness of the oxide layer can be 0.2 microns, 0.6 microns, 1.2 microns, etc.

When light 312 (which included both visible light and IR light) is incident upon the $N^+$ region of the sensor 302, a large portion of the photons of visible light is absorbed by the $N^+$ region 304 and the $P^-$ region 306. Such photons will contribute to the photocurrent generated by the sensor 302. In contrast, a majority of the IR light will penetrate through the oxide layer 310 and be absorbed by the substrate layer 307 (which can be, e.g., a silicon layer) and thus not contribute to the photocurrent generated by the sensor 302. In this manner, the contribution of the IR light to the photocurrent is significantly reduced, and preferably nullified. Thus, because the photocurrent generated by the sensor 302 is primarily due to visible light, the sensor 302 has a spectral response that more closely matches that of a human eye, as compared to the conventional sensor 102.

Stated another way, carriers are produced in the $P^-$ layer 306 when light 312, including both visible light and infrared light, is incident on the light sensor 102. A portion of the carriers produced due to the visible light are captured by the $N^+$ region 304 and contribute to a photocurrent generated by the light sensor 102. A further portion of the carriers, produced due to the IR light that penetrates through the oxide layer 310, is isolated from the diode by the oxide layer 310 or a material 307 below the oxide layer and thus does not contribute to the photocurrent. This results in the photocurrent being primarily representative of the visible light.

The embodiments described with reference to FIG. 3 can be manufactured using Silicon-on-insulator (SOI) technology, where a thin silicon layer lies atop an insulator, such as silicon dioxide, which in turn lies atop a bulk substrate (also known as a handle wafer). This allows for isolation of the active silicon layer containing circuit structures from the bulk substrate. Referring back to FIG. 3, the $P^-$ region 306 can be such a thin active silicon layer, the oxide 310 can be such an insulator, and the substrate 307 can be a bulk substrate. In accordance with specific embodiments, the bulk substrate (e.g., 307) can be removed to suppress reflection that may otherwise be caused by the bulk substrate. Where this occurs, the IR light that penetrates the oxide insulator 310 will be absorbed by chip packaging material, such as an epoxy or molding compound.

The embodiment described with reference to FIG. 3 can alternatively be manufactured using Silicon-on-sapphire (SOS) technology, where a thin silicon layer is grown on a substrate of sapphire ($Al_2O_3$), which is an oxide. Referring back to FIG. 3, the $P^-$ region 306 can be such a thin active silicon layer, and the layers 310 and 307 are replaced with a single sapphire layer.

While a single PN junction above an oxide layer is shown in FIG. 3, embodiments of the present invention also encompass multiple such PN junctions above a single oxide layer, or multiple oxide layers. In other words, embodiments of the present invention also encompass multiple such photodetectors that are collectively used to a produce a photocurrent. One of ordinary skill in the art would appreciate how this multiplicity of photodetectors also applies to the embodiments described below. These IR rejection schemes could alternatively be implemented using a P+/N− photodiode construction, as explained in more detail below.

Figure 4A:
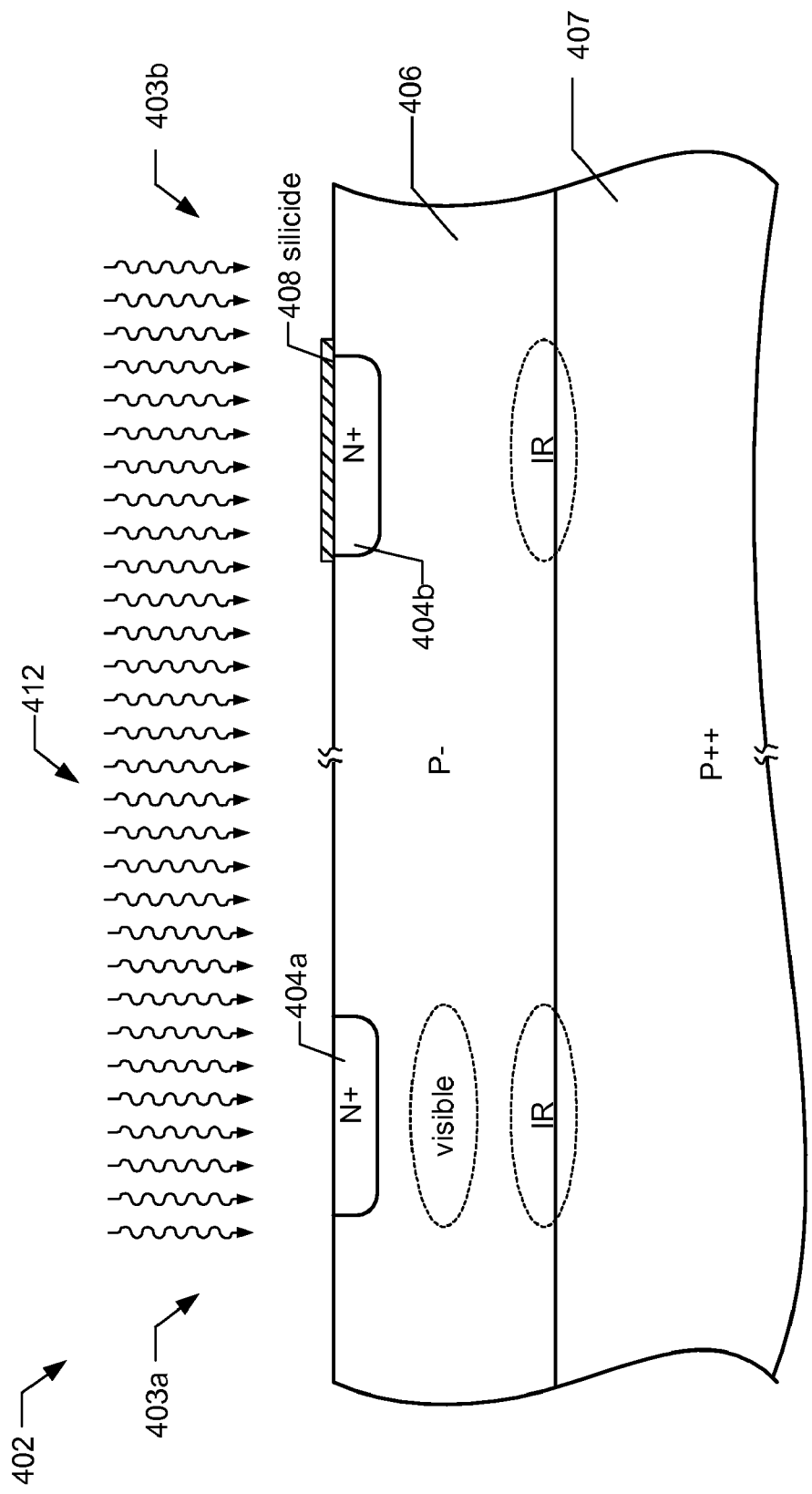
FIG. 4A is a cross-sectional view of a light sensor according to another embodiment of the present invention.

FIG. 4A is a cross sectional view of a CMOS light sensor 402 according to another embodiment of the present invention. The light sensor 402 is shown as including two photodetectors 403a and 403b, which are preferably spaced sufficiently apart from one another such that they can be considered substantially isolated from one another. Additionally, or alternatively, the two photodetectors 403a and 403b be isolated from one another using an isolating region (not shown).

Figure 1:
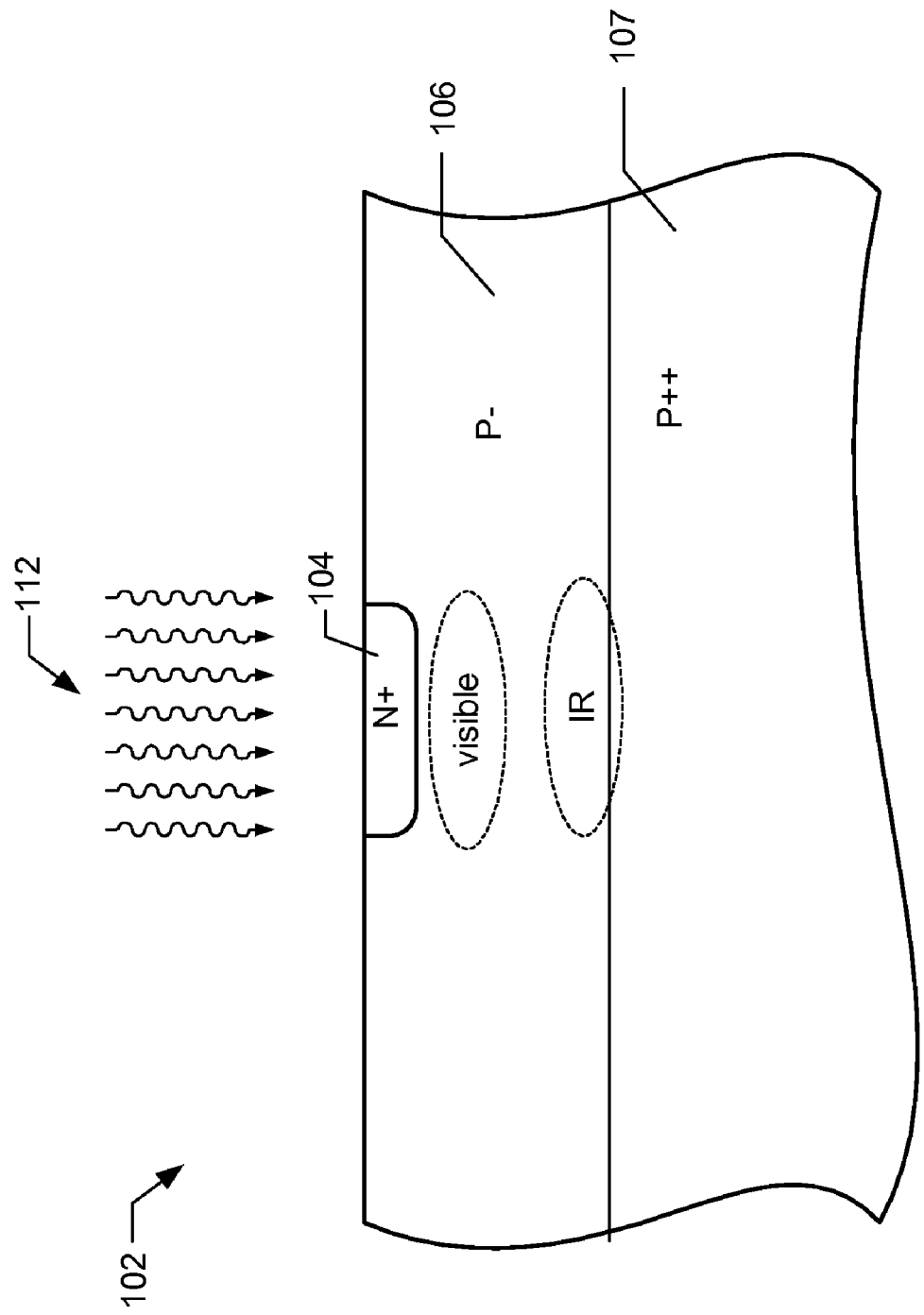
FIG. 1 is a cross-sectional view of a conventional CMOS photodetector type light sensor.

The photodetector 403a, which includes an $N^+$ region 404a within a $P^-$ layer 406, is essentially the same as a conventional photodetector such as the one described with reference to FIG. 1. Thus, when light 412 is incident upon the photodetector 403a, the photocurrent produced by the photodetector 403a will be indicative of both visible light and IR light that is incident upon the detector.

The other photodetector 403b similarly includes an $N^+$ region 404b within the $P^-$ layer 406, which can be a $P^-$ epitaxial layer. However, the $N^+$ region of the photodetector 403b is covered by a silicide layer 408 that is native to the CMOS process. The silicide layer 408 is opaque to visible light (i.e., does not let visible light pass through), yet lets a portion of the IR light pass through. Thus, when light 412 is incident upon the light sensor 402, the photocurrent produced by the photodetector 403b will not be indicative of visible light incident upon the detector, but will be indicative of IR light incident upon the detector.

Thus, the sensor 402 produces a first photocurrent indicative of both visible light and IR light, and a second photocurrent indicative of IR light. In accordance with embodiments of the present invention, by determining a difference between such photocurrents, a differential photocurrent primarily indicative of visible light can be produced. Such a differential photocurrent corresponds to a spectral response close to that of a human eye.

Stated another way, the light sensor 402 includes the $P^-$ layer 406 within which are the $N^+$ regions 404a and 404b. The $N^+$ region 404a and the $P^-$ layer 406 form a first PN junction photodiode 403a, and the $N^+$ region 404b and the $P^-$ layer 406 form a second PN junction photodiode 403b. The silicide layer 408, which is intrinsic to CMOS technology, covers the $N^+$ region 404b (but not the $N^+$ region 404a) to thereby block visible light while allowing at least a portion IR light to pass through. Carriers are produced in the $P^-$ layer when light 412, including both visible light and IR light, is incident on the light sensor 402. A portion of the carriers produced due to the visible light and the IR light incident on the $N^+$ region 404a are captured by the $N^+$ region 404a and contribute to a first photocurrent that is indicative of both the visible light and the IR light. A further portion of the carriers, produced due to the IR light that passes through the silicide layer 308, are captured by the $N^+$ region 404b and contribute to a second photocurrent that is indicative of the IR light. A differential photocurrent, produced by determining a difference (likely a weighed difference) between the first and second photocurrents, has a spectral response with at least a majority of the IR light removed.

The thickness of the silicide layer 408, which is dependent upon the CMOS process, will typically be on the order of about 0.01 microns to 0.04 microns, but is not limited thereto. Such thickness will affect that amount of IR light that penetrates through the silicide 408 and contributes to the photocurrent of the detector 403b. Even a very thin layer of silicide 408 will block some of the IR light. Thus, in accordance with specific embodiments of the present invention, an empirically determined weighting factor is used to compensate for the photocurrent produced by photodetector 403b being indicative of only a portion of the IR light incident upon the photodetector 403b.

Figure 4B:
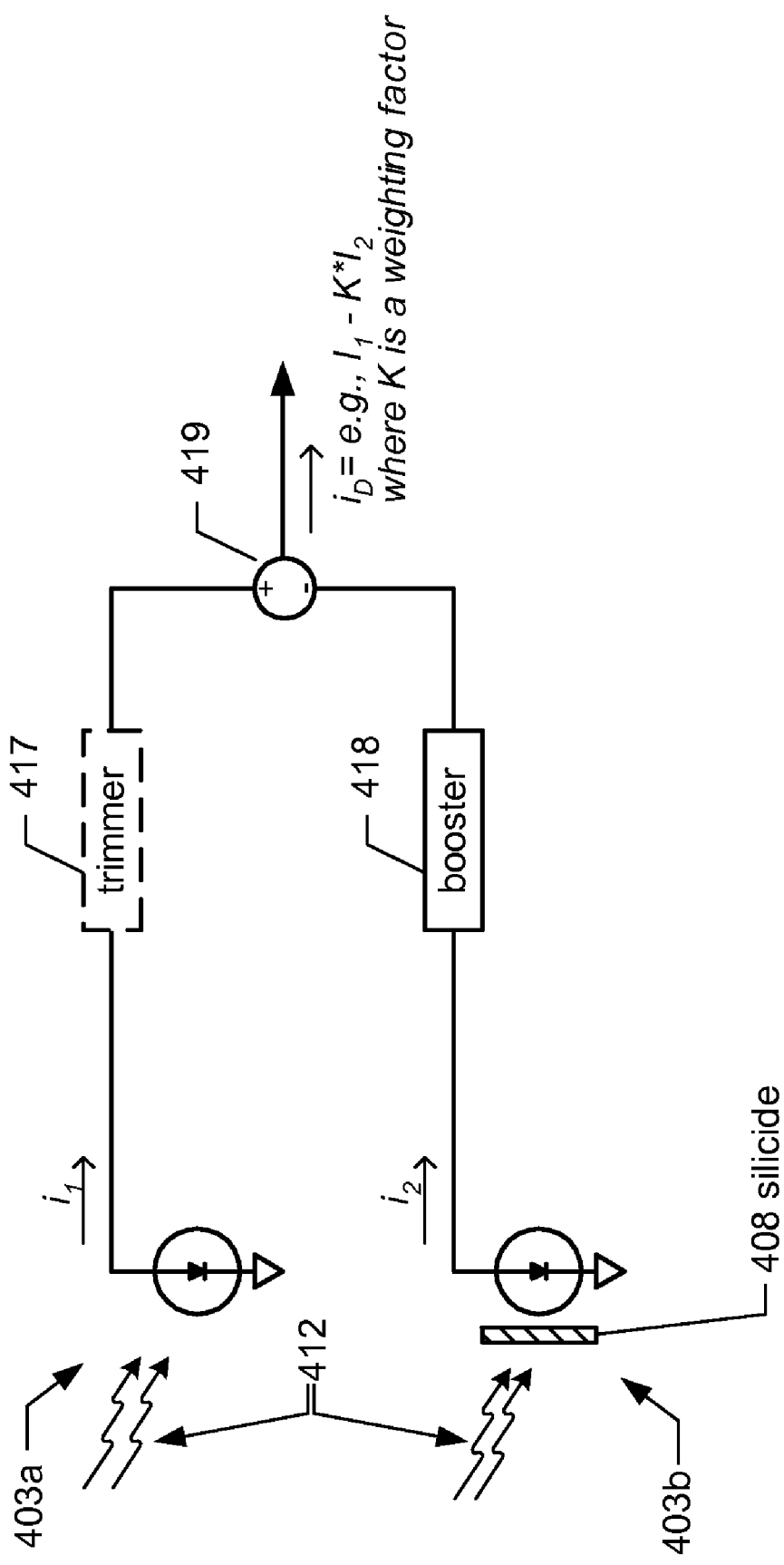
FIG. 4B is a high level block diagram that explains how a difference can be determined between photocurrents produced by the two photodetectors of the light sensor of FIG. 4A.

FIG. 4B illustrates how such a weighted subtraction can be accomplished, e.g., using a current trimmer 417 and/or a current booster 418, and a differencer 419. The differencer 419 can be a differential amplifier, but is not limited thereto. The current trimmer and booster can be implemented using amplifiers having appropriate gains to provide the desired weighting. As with each of the embodiments of the present invention, the appropriate weighting values can be determined in any of a number of different manners. For example, simulations can be used, trial and error type experimentation can be used or theoretical calculations can be performed. More likely, combinations of these various techniques can be used to appropriately select the proper weighting factors. For example, simulations and/or theoretical calculations can be used to determine approximate weighting factors (e.g., which can result in specific values for resistors of an amplifier circuit), and then trial and error type experimentation can be used to fine tune the factors/values. It is also possible that photocurrents can be converted to voltages (e.g., using transimpedance amplifiers), and the voltages can be appropriately adjusted, and a difference of voltages determined. These are just a few examples, which are not meant to be limiting. One of ordinary skill in the art will appreciate that many other ways for adjusting currents and/or voltages are within the spirit and scope of the present invention. For example, programmable devices (e.g., a programmable digital-to-analog converter (DAC)) can be used to appropriately adjust voltages and/or currents. An advantage of using a programmable device is that it may selectively adjust the appropriate gain(s) based on additional variables, such as temperature. It is also noted that current signals or voltage signals can be converted into the digital domain and all further processing of these signals (e.g., adjusting of one or more signals and determining a difference between signals) can be performed in the digital domain, rather than using analog components. Such digital domain processing can be performed using dedicated digital hardware or on a general purpose processor, such as a microprocessor. Other techniques for determining the differential photocurrent are also within the scope of the present invention.

Figure 5A:
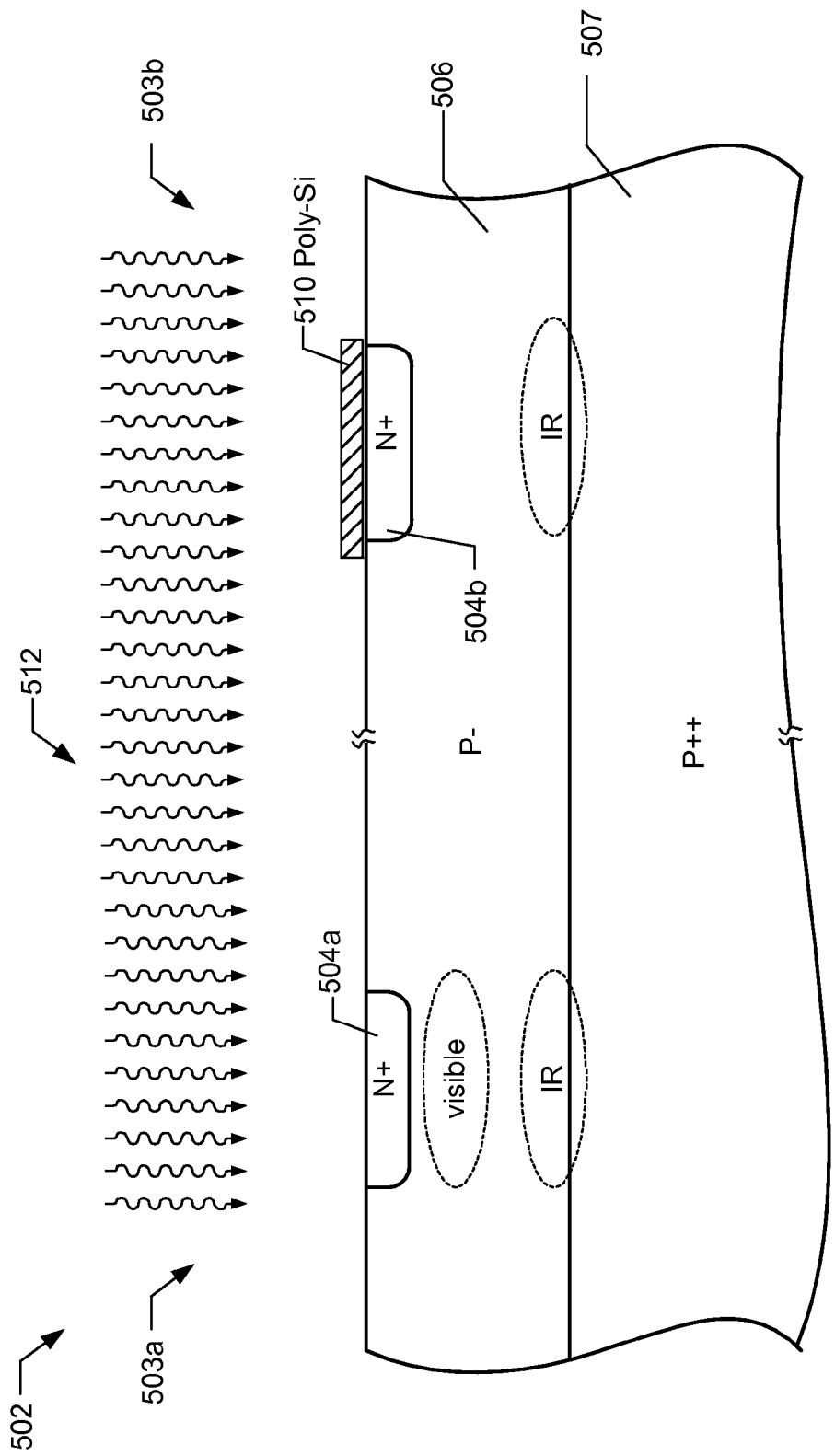
FIG. 5A is a cross-sectional view of a light sensor according to a further embodiment of the present invention.

FIG. 5A is a cross sectional view of a CMOS light sensor 502 according to another embodiment of the present invention. The light sensor 502 is shown as including two photodetectors 503a and 503b, which are preferably spaced sufficiently apart from one another such that they can be considered substantially isolated from one another. Additionally, or alternatively, the two photodetectors 503a and 503b can be isolated from one another using an isolating region (not shown).

The photodetector 503a, which includes an N+ region 504a within a P− layer 506, is essentially the same as a conventional photodetector such as the one described with reference to FIG. 1, and the photodetector 403a discussed with reference to FIG. 4A. Thus, for additional details of photodetector 503a refer to the descriptions above. When light 512 is incident upon the photodetector 503a, the photocurrent produced by the photodetector 503a will be indicative of both visible light and IR light that is incident upon the detector.

The other photodetector 503b also includes an N+ region 504b within the P− layer 506. However, the N+ region of the photodetector 503b is covered by a Poly-Silicon (Poly-Si) layer 510 that is native to the CMOS process. Such a Poly-Si layer 508, which is typically used to form a gate of a CMOS transistor, is opaque to visible light (i.e., does not let visible light pass through), yet lets a portion of the IR light pass through. Thus, when light 512 is incident upon the photodetector 503b, the photocurrent produced by the photodetector 503b will not be indicative of visible light incident upon the detector, but will be indicative of IR light incident upon the detector.

Thus, the sensor 502 produces a first photocurrent indicative of both visible light and IR light, and a second photocurrent indicative of IR light. In accordance with embodiments of the present invention, by determining a difference between such photocurrents, a differential photocurrent primarily indicative of visible light can be produced. Such a differential photocurrent is thus indicative of the spectral response of a human eye.

Stated another way, the light sensor 502 includes the P− layer 506 within which are the N+ regions 504a and 504b. The N+ region 504a and the P− layer 506 form a first PN junction photodiode 503a, and the N+ region 504b and the P− layer 506 form a second PN junction photodiode 503b. The Poly-Si layer 510, which is intrinsic to CMOS technology, covers the N+ region 504b (but not the N+ region 504a) to thereby block visible light while allowing at least a portion IR light to pass therethrough. Carriers are produced in the P− layer when light 512, including both visible light and IR light, is incident on the light sensor 502. A portion of the carriers produced due to the visible light and the IR light incident on the N+ region 504a are captured by the N+ region 504a and contribute to a first photocurrent that is indicative of both the visible light and the IR light. A further portion of the carriers, produced due to the IR light that passes through the Poly-Si layer 510, are captured by the N+ region 504b and contribute to a second photocurrent that is indicative of the IR light. A differential photocurrent, produced by determining a difference (likely a weighed difference) between the first and second photocurrents, has a spectral response with at least a majority of the IR light removed.

Figure 5B:
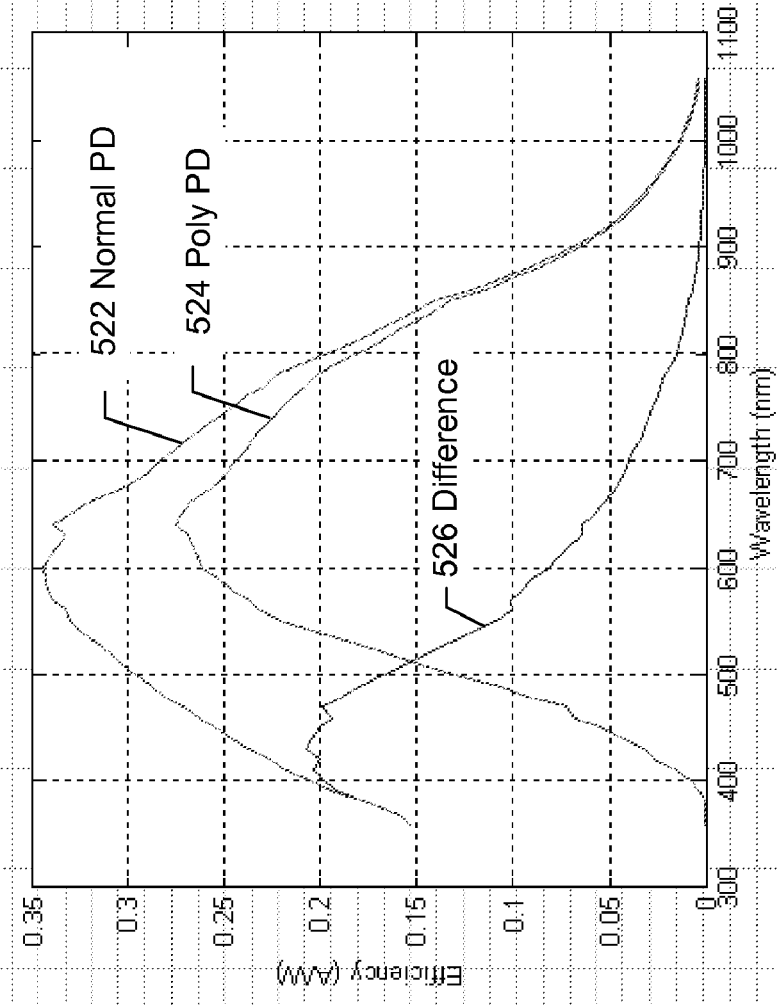
FIG. 5B is a graph that illustrates a simulated spectral response achieved using the light sensor of FIG. 5A.

FIG. 5B is a graph that illustrates a simulated spectral response achieved using the light sensor 502 of FIG. 5A. Referring to FIG. 5B, the line 522 illustrates the simulated spectral response of the normal photodetector 503a, and the line 524 illustrates a simulated spectral response of the photodetector 503b that is covered by the Poly-Si layer 510. Line 526 illustrates the differential response associated with the differential photocurrent, where the magnitude of the photocurrent from the photodetector 503b was multiplied by a 1.42 weighting factor (also referred to as a normalization factor). Similar techniques to those described above with reference to FIG. 4B can be used to produce the differential photocurrent. Other techniques for determining the differential photocurrent are also within the scope of the present invention.

In an alternative embodiment, a layer of silicide is formed over the Poly-Si layer 510 of the photodetector 503b, which results in an embodiment that combines the features of the embodiments of FIGS. 5A and 4A.

Figure 5C:
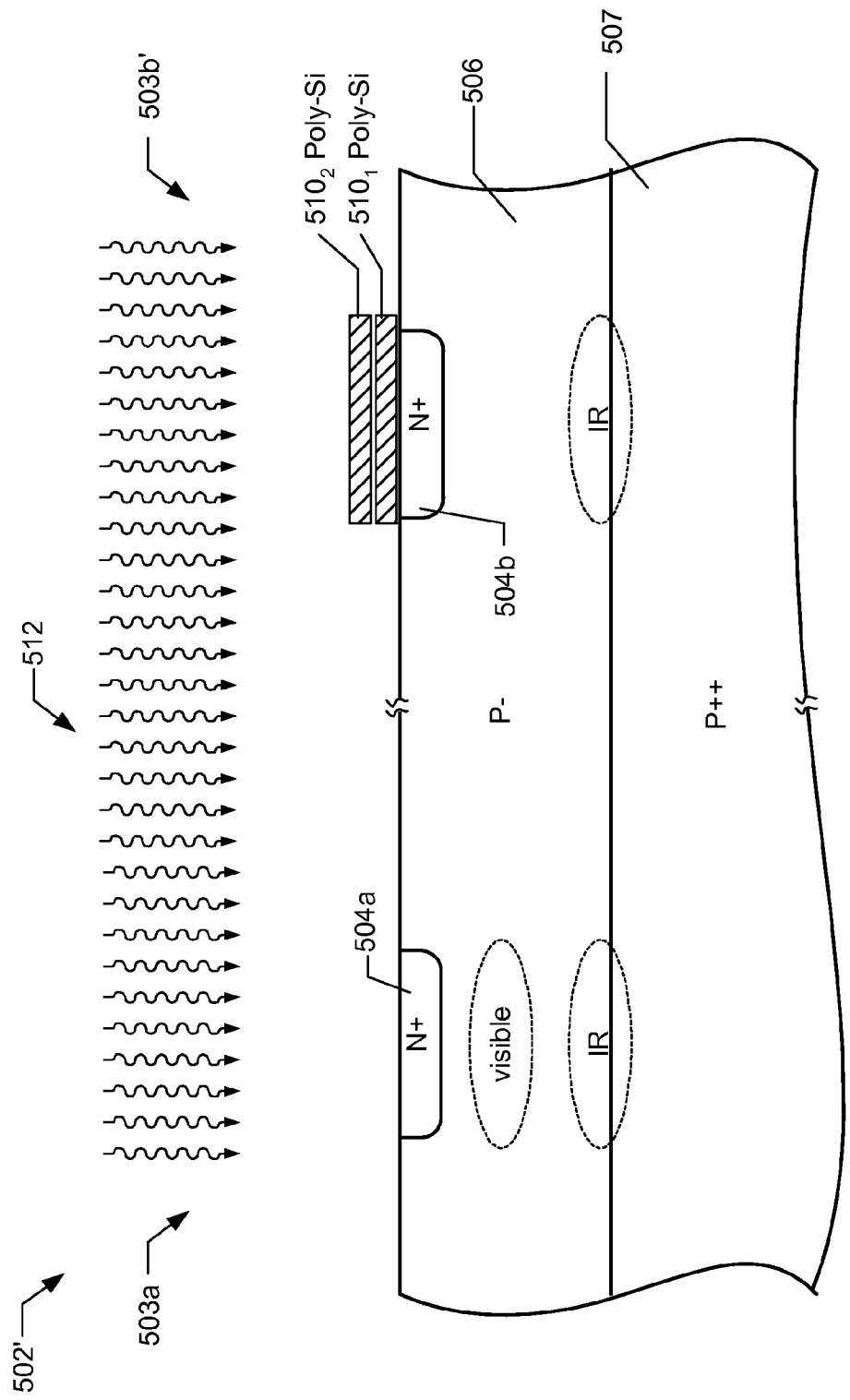
FIG. 5C is a cross-sectional view of a variation of the light sensor shown in FIG. 5A.
Figure 5D:
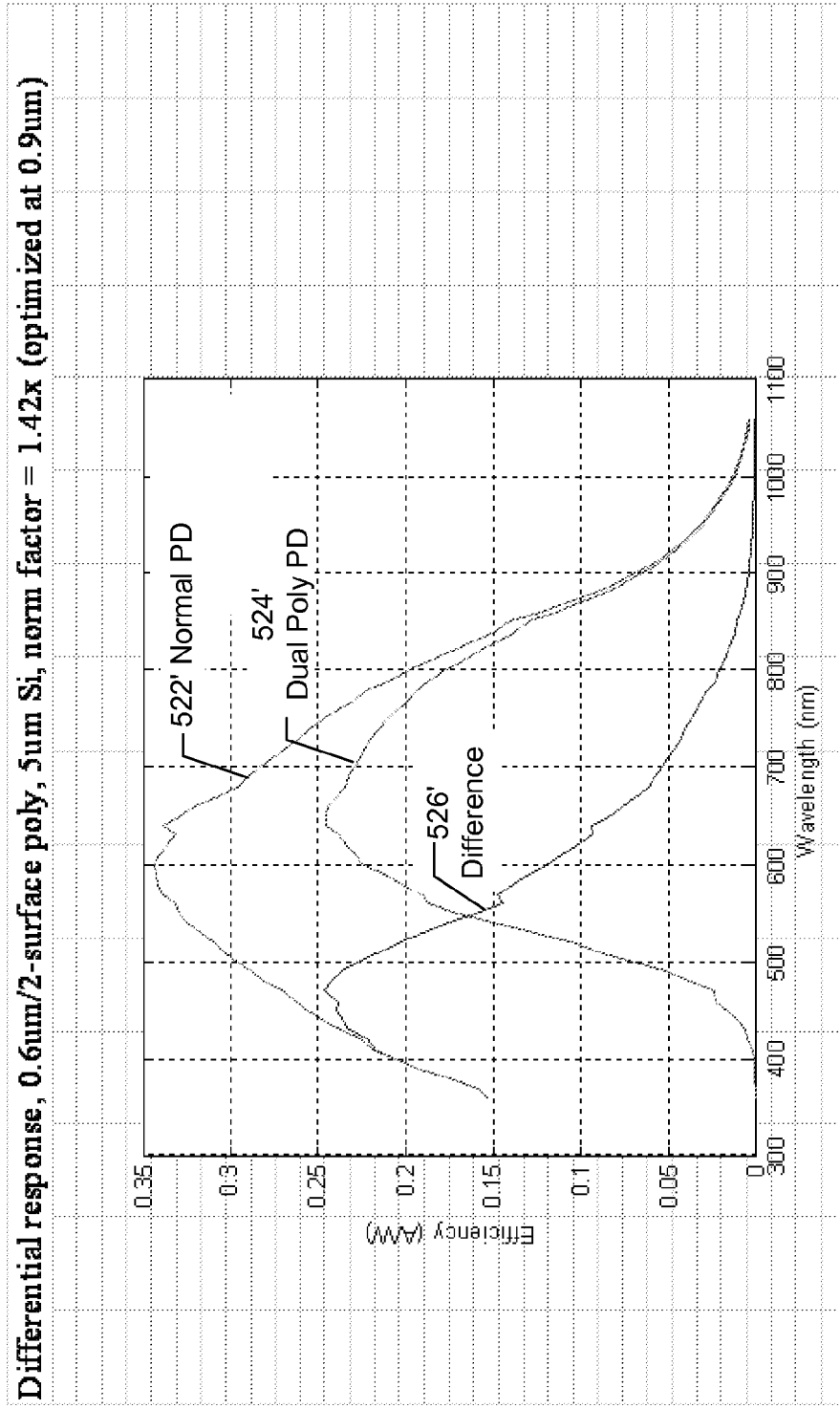
FIG. 5D is a graph that illustrates a simulated spectral response achieved using the light sensor of FIG. 5C.

In a further embodiment, shown in FIG. 5C, a sensor 502' includes the photodetector 503a and a photodetector 503b' having two layers of Poly-Si $510_1$ and $510_2$ formed over the N+ region 504b. FIG. 5D is a graph that illustrates the simulated spectral response achieved using the light sensor 502' of FIG. 5C. Referring to FIG. 5D, the line 522' illustrates the simulated spectral response of the normal photodetector 503a and the line 524' illustrates the simulated spectral response of the photodetector 503b' that is covered by the two Poly-Si layers $510_1$ and $510_2$. Line 526' illustrates the differential response, where the magnitude of the photocurrent from the photodetector 503b' was multiplied by a 1.42 normalization factor. Similar techniques to those described above with reference to FIG. 4B can be used to produce the differential photocurrent. Other techniques for determining the differential photocurrent are also within the scope of the present invention.

Even further layers of Poly-Si can be added, if desired. In an alternative embodiment, a layer of silicide is formed over the top Poly-Si layer (e.g., 510₂) of the photodetector 503b', which results in an embodiment that combines the features of the embodiments of FIG. 5C and 4A.

Figure 2:
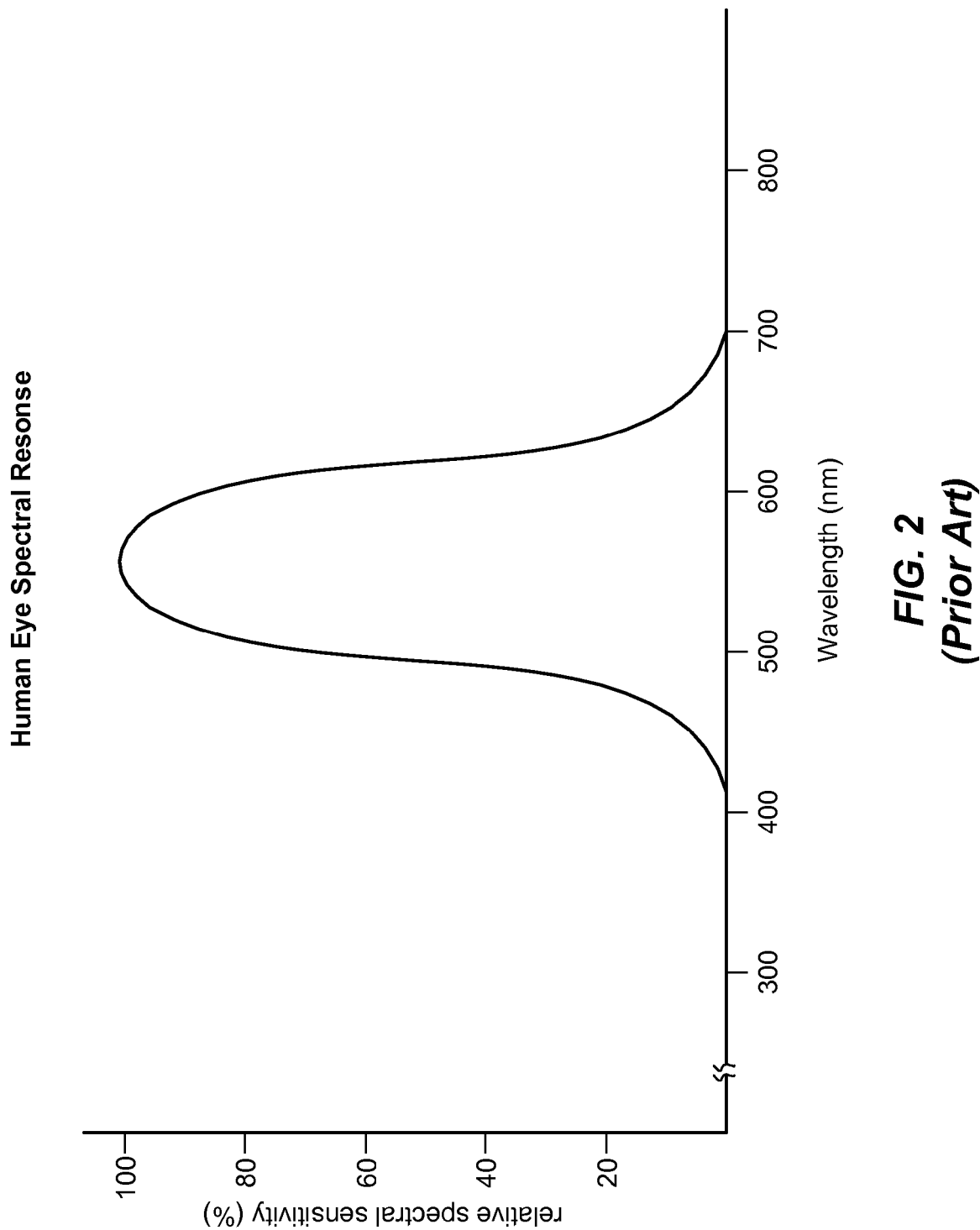
FIG. 2 is a graph showing an exemplary spectral response of a human eye.

Referring back to FIG. 2, it can be seen that the spectral response of a human eye peaks at about 550 nm. Referring back lines to 526 and 526' in FIGS. 5B and 5D, it can be seen that peaks in the simulated differential spectral responses for sensors 502 and 502' occur between 400 nm and 500 nm. In accordance with specific embodiments of the present invention, a green filter (e.g., an about 550 nm filter) can be placed over sensors 502 and 502' to cause the peaks of the differential responses to be closer to 550 nm.

In the embodiments of FIGS. 5A and 5C, as well as in the embodiment of FIG. 4A, the light sensors each include a normal photodetector and a photodetector that is covered by at least one layer intrinsic to CMOS technology that blocks visible light while allowing at least a portion of IR light to pass through. The layer(s) intrinsic to CMOS technology can be a silicide layer, one or more Poly-Si layer, or combinations thereof, but are not limited thereto. Additionally, in the embodiments of FIGS. 5A and 5C, as well as the embodiment of FIG. 4A, a difference is determined (and more likely a weighted difference) between the photocurrents produced by the two photodetectors, with the response of the differential photocurrent (referred to as the differential response) resembling that of a human eye.

Figure 6A:
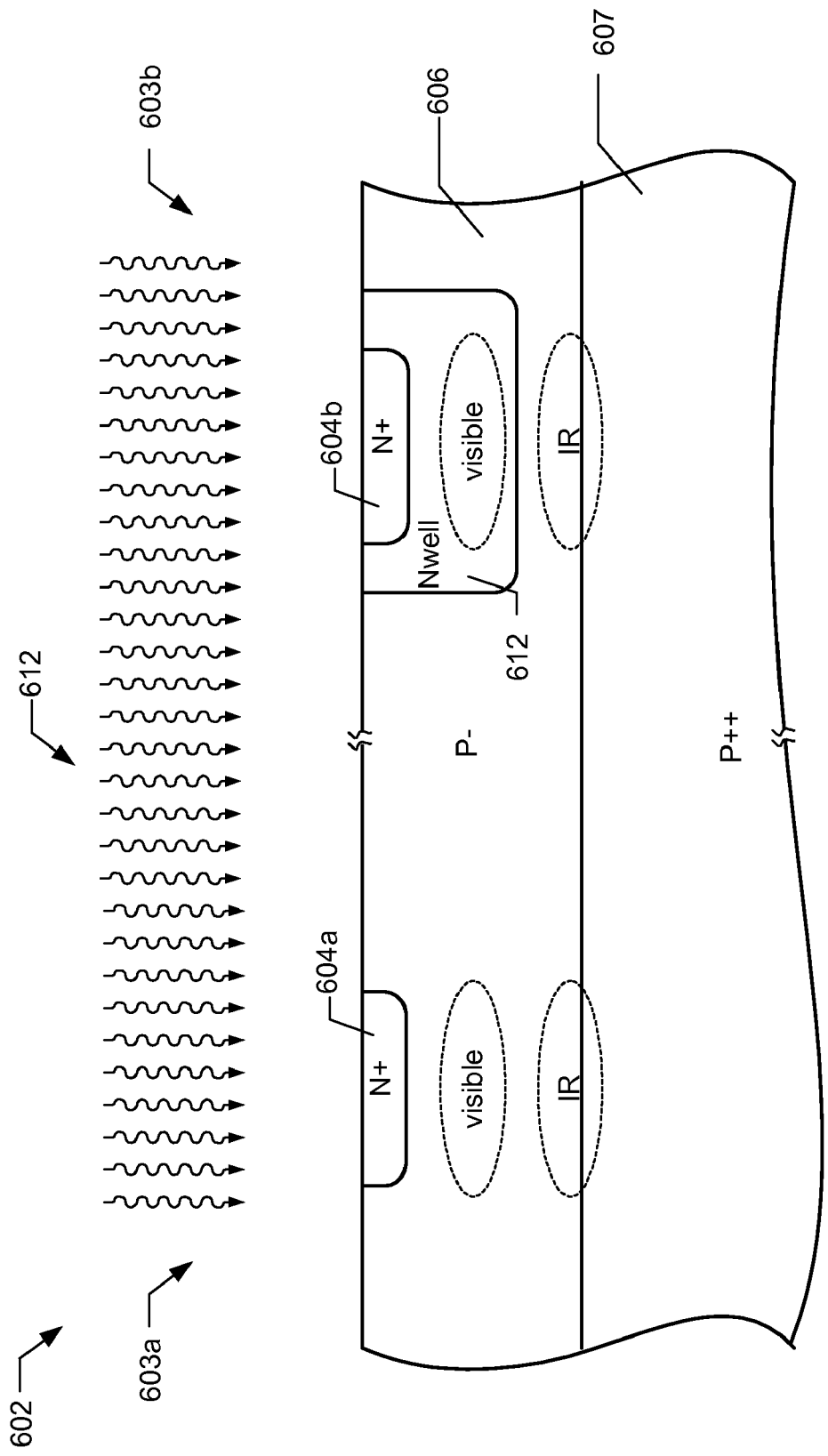
FIG. 6A is a cross-sectional view of a light sensor according to still another embodiment of the present invention.

FIG. 6A is a cross sectional view of a CMOS light sensor 602 according to another embodiment of the present invention. The light sensor 602 is shown as including two photodetectors 603a and 603b, which are preferably spaced sufficiently apart from one another such that they can be considered substantially isolated from one another. Additionally, or alternatively, the two photodetectors 603a and 603b can be isolated from one another using an isolating region (not shown).

The photodetector 603a, which includes an N⁺ region 604a within a P⁻ layer 606, is essentially the same as a conventional photodetector such as the one described with reference to FIG. 1, and the photodetector 403a discussed with reference to FIG. 4A. Thus, for additional details of photodetector 603a refer to the descriptions above. When light 612 is incident upon the photodetector 603a, the photocurrent produced by the photodetector 603a will be indicative of both visible light and IR light that is incident upon the detector.

The other photodetector 603b includes an Nwell 612 within the P⁻ layer 606, and an N⁺ region 604b within the Nwell 612, with the N⁺ region is more heavily doped than the Nwell 612. Here, the PN junction of the photodiode 603b occurs between the Nwell 612 and the P⁻layer 606, which can be a P⁻ epitaxial layer. Preferably, the Nwell 604b is deep enough that it absorbs the photons of visible light, thus reducing (and preferably preventing) the visible light from contributing to the photocurrent produced by the photodetector 603b. In contrast, the photons of IR light will penetrate deeper into the photodetector 603b, below the Nwell 612. This will result in the photodetector 603b producing a photocurrent that is primarily indicative of the IR portion of the light 612.

Stated another way, the light sensor 602 includes the P⁻ layer 606 within which are the N⁺ region 604a and the Nwell 612. The N⁺ region 604b is within the Nwell 612. The N⁺ region 604a and the P⁻ layer 606 form a first PN junction photodiode 603a. The Nwell 612 and the P⁻ layer 606 form a second PN junction photodiode 603b. Carriers are produced in the P⁻ layer when light 612, including both visible light and IR light, is incident on the light sensor 602. A portion of the carriers produced due to the visible light and the IR light incident on the N⁺ region 604a are captured by the N⁻ region and contribute to a first photocurrent that is indicative of both the visible light and the IR light. A further portion of the carriers, produced due to the IR light that passes through the Nwell, are captured by the N⁺ region 604b in the Nwell 612 and contribute to a second photocurrent that is indicative of the IR light. A differential photocurrent, produced by determining a difference (likely a weighed difference) between the first and second photocurrents, has a spectral response with at least a majority of the IR light removed.

In accordance with specific embodiments, the depth of the Nwell 612 ranges from about 1 to 3 microns, and the depth of the N⁺ region 604b ranges from about 0.2 to 0.5 microns.

Figure 6B:
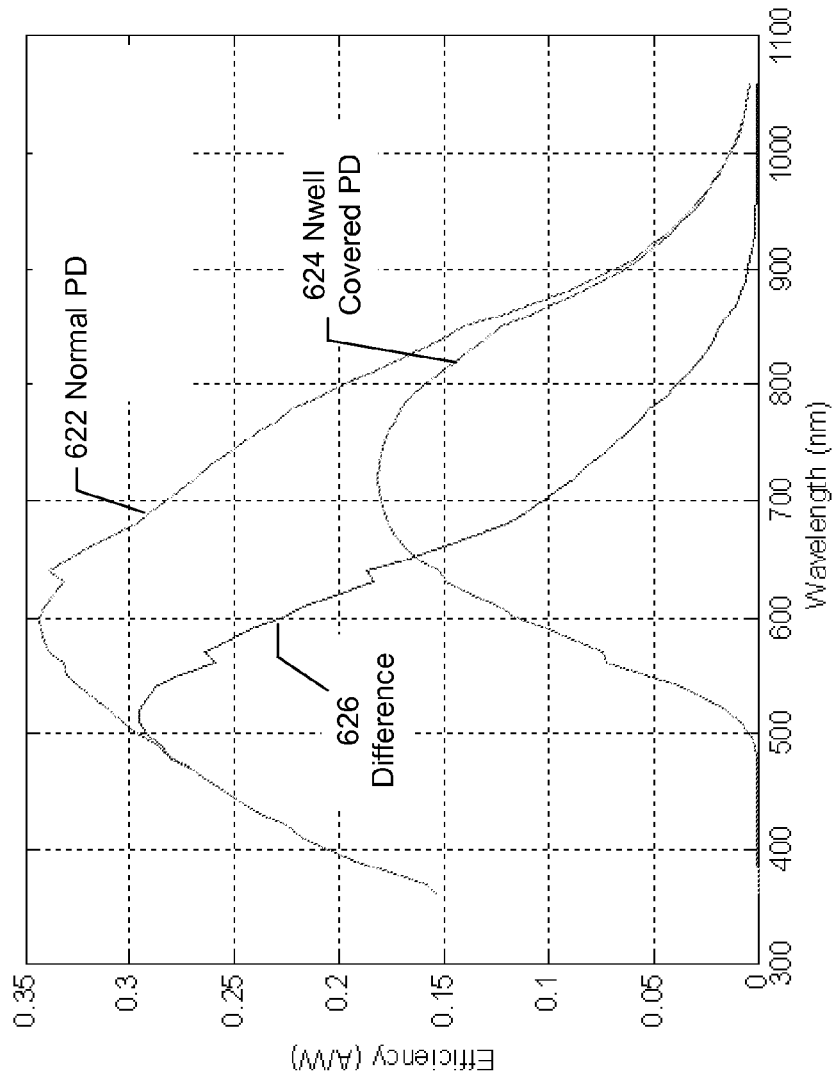
FIG. 6B is a graph that illustrates the simulated spectral response achieved using the light sensor of FIG. 6A.

FIG. 6B is a graph that illustrates the simulated spectral response achieved using the light sensor 602 of FIG. 6A, where the depth of the Nwell 612 is 2 microns. Referring to FIG. 5B, the line 622 illustrates the simulated spectral response of the normal photodetector 603a and the line 624 illustrates the simulated spectral response of the photodetector 603b that has the N⁺ region 604b within the Nwell 612. Line 626 illustrates the differential response associated with the differential photocurrent, where the magnitude of the photocurrent from the photodetector 603b was multiplied by a 1.20 normalization factor. Similar techniques to those described above with reference to FIG. 4B can be used to produce the differential photocurrent. Other techniques for determining the differential photocurrent are also within the scope of the present invention.

Figure 6C:
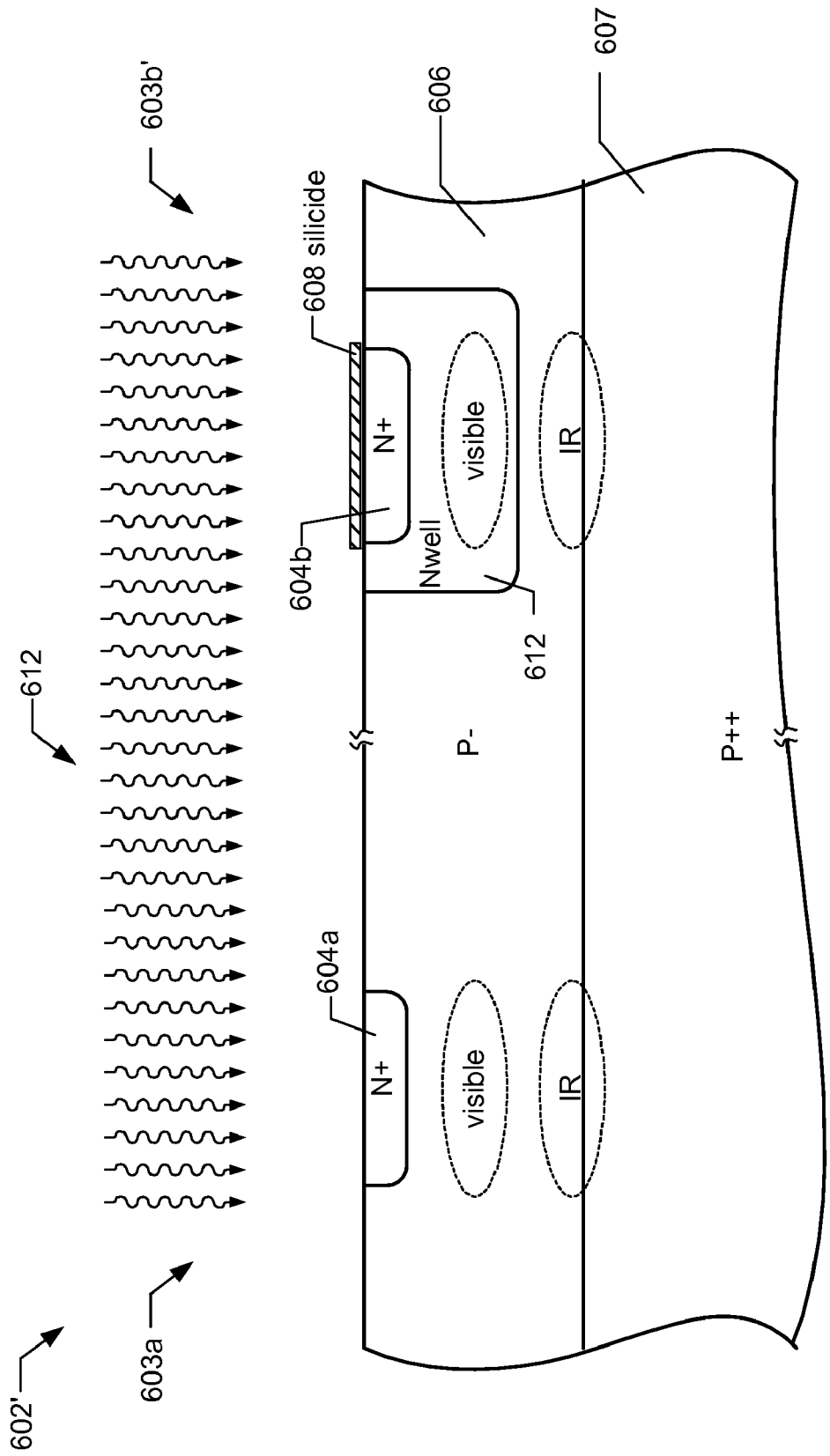
FIG. 6C is a cross-sectional view of a light sensor similar to that of FIG. 6A, but also including features of the sensor of FIG. 4A.

In accordance with another embodiment of the present invention, shown in FIG. 6C, a sensor 602' is similar to sensor 602, except a layer of silicide 608 (similar to silicide 408 discussed with reference to FIG. 4A) is formed over the N⁺ region 604b to form a photodetector 603b'. This results in an embodiment that combines the features of the embodiments of FIGS. 6A and 4A.

Figure 6D:
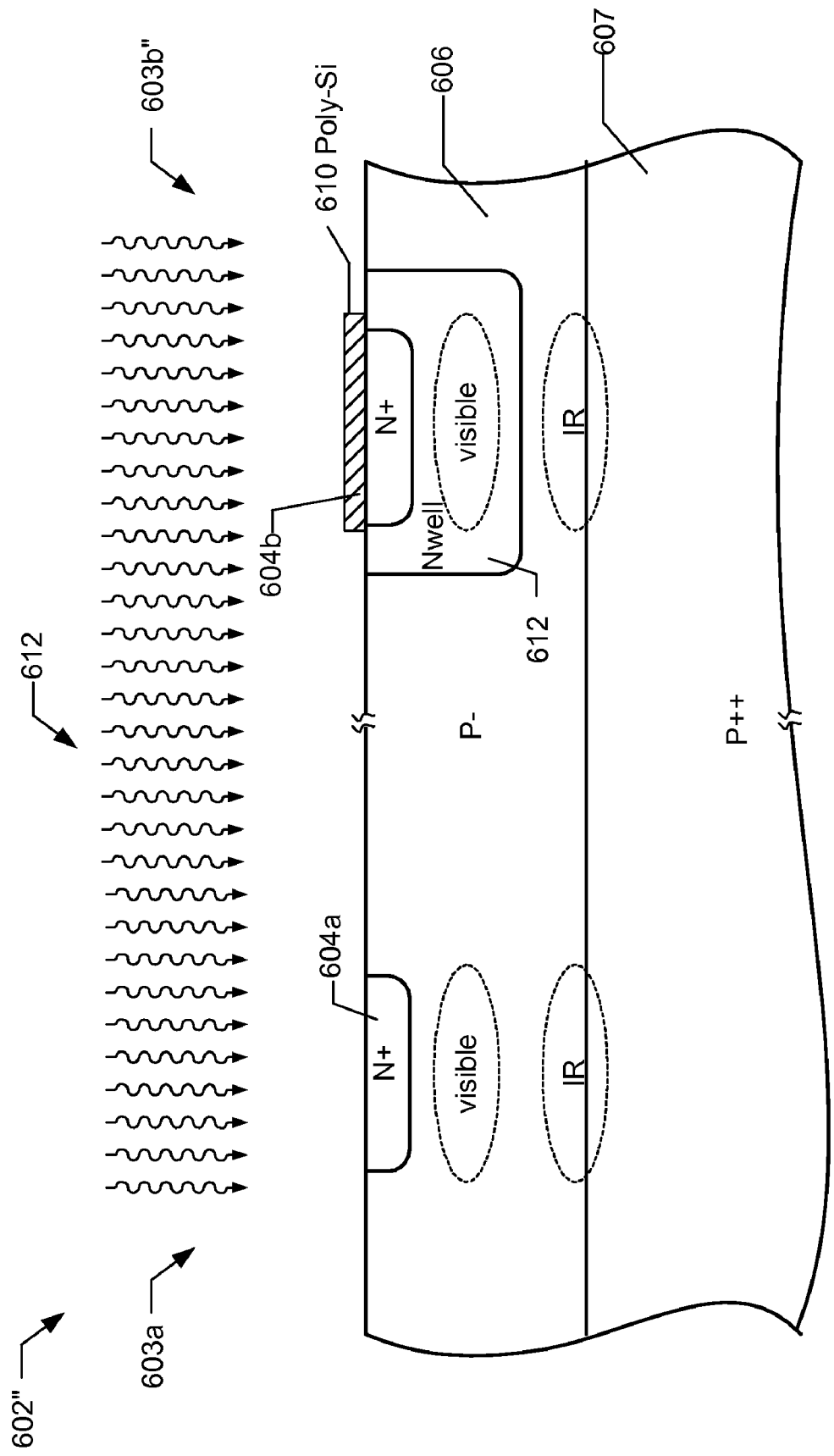
FIG. 6D is a cross-sectional view of a light sensor similar to that of FIG. 6A, but also including features of the sensor of FIG. 5A.

In accordance with a further embodiment of the present invention, shown in FIG. 6D, a sensor 602" is similar to sensor 602, except a layer of Poly-Silicon 610 (similar to the Poly-Si layer 510 discussed with reference to FIG. 5A) is formed over the N⁺ region 604b to form a photodetector 603b". This results in an embodiment that combines the features of the embodiments of FIGS. 6A and 5A. Additionally, a silicide layer can be formed over Poly-Si layer 610. One or more further layer of Poly-Si can be formed over the Poly-Si layer 610, as was discussed with reference to FIG. 5C. A silicide layer can be formed over the top Poly-Si layer.

In the above described embodiments, N⁺ regions are described as being located or implanted within a P⁻ layer. For example, in the embodiment of FIG. 3, the N⁺ region 304 is located or implanted within the P⁻ layer 306. Alternatively, region 304 can be a P⁺ region and layer 306 can be an N⁻ layer. For another example, in the embodiment of FIG. 4A, N⁺ regions 404a and 404b are shown as being implanted in the P⁻ layer 406, which is on top of a P⁺⁺ layer 407. In alternative embodiments, the semiconductor conductivity materials are reversed. That is, heavily doped P⁺ regions can be implanted in a lightly doped N⁻ layer, on top of a heavily doped N⁺⁺ layer. Similar variations also apply to the other embodiments of the present invention. Each such variation is also within the scope of the present invention.

Embodiments of the present invention are also directed to methods of producing photocurrents that are primarily indicative of visible light, but not IR light. In other words, embodiments of the present invention are also directed to methods for providing a light sensor having a spectral response similar to that of the human eye. Additionally, embodiments of the present invention are also directed to methods of using the above described light sensors.

While various embodiments of the present invention have been described above, it should be understood that they have been presented by way of example, and not limitation. It will be apparent to persons skilled in the relevant art that various changes in form and detail can be made therein without departing from the spirit and scope of the invention.

The breadth and scope of the present invention should not be limited by any of the above-described exemplary embodiments, but should be defined only in accordance with the following claims and their equivalents.

What is claimed is:

1. A light sensor, comprising:
    a layer of a first conductivity type;
    a first region of a second conductivity type in the layer of the first conductivity type and forming a first PN junction photodiode with the layer of the first conductivity type, wherein the first PN junction photodiode is generally perpendicular to a surface of the first region that is not in contact with the layer of the first conductivity type;
    a second region of the second conductivity type in the layer of the first conductivity type and forming a second PN junction photodiode with the layer of the first conductivity type, wherein the second PN junction photodiode is generally perpendicular to a surface of the second region that is not in contact with the layer of the first conductivity type; and
    at least one further layer intrinsic to CMOS technology that covers the second region of the second conductivity type, but not the first region of the second conductivity, the at least one further layer blocking visible light while allowing at least a portion of infrared (IR) light to pass therethrough;
    wherein carriers are produced in the layer of the first conductivity type when light, including both visible light and IR light, is incident on the light sensor;
    wherein a portion of the carriers produced due to the visible light and the IR light incident on the first region of the second conductivity type are captured by the first region of the second conductivity type and contribute to a first photocurrent that is generally perpendicular to the at least one further layer and is indicative of both the visible light and the IR light; and
    wherein a further portion of the carriers, produced due to the IR light that passes through the at least one further layer, are captured by the second region of the second conductivity type and contribute to a second photocurrent that is generally perpendicular to the at least one further layer and is indicative of the IR light; and
    wherein a differential photocurrent, produced by determining a difference between the first and second photocurrents, has a spectral response with a significant part of the IR light removed.

2. The light sensor of claim 1, where the difference used to produce the differential current is a weighted difference that compensates for at least a portion of the IR light not passing through the at least one further layer.

3. The light sensor of claim 2, wherein the layer of the first conductivity type comprises an epitaxial layer.

4. The light sensor of claim 1, wherein:
    the layer of the first conductivity type comprises a P$^-$ layer;
    the first region of the second conductivity type comprises a first N$^+$ region; and
    the second region of the second conductivity type comprises a second N$^+$ region.

5. The light sensor of claim 1, wherein:
    the layer of the first conductivity type comprises an N$^-$ layer;
    the first region of the second conductivity type comprises a first P$^+$ region; and
    the second region of the second conductivity type comprises a second P$^+$ region.

6. The light sensor of claim 1, wherein the at least one further layer includes a layer of silicide.

7. The light sensor of claim 1, wherein the at least one further layer includes a layer of Poly-Silicon.

8. The light sensor of claim 1, wherein the at least one further layer includes a layer of Poly-Silicon covering the second region of the second conductivity type, and a layer of silicide over the Poly-Silicon.

9. The light sensor of claim 1, wherein the at least one further layer includes a first layer of Poly-Silicon covering the second region of the second conductivity type, and at least one further layer of Poly-Silicon over the first layer of Poly-Silicon.

10. The light sensor of claim 9, wherein the at least one further layer includes a layer of silicide over the uppermost layer of Poly-Silicon.

* * * * *